United States Patent
Matsuda et al.

(10) Patent No.: US 8,680,923 B2
(45) Date of Patent: Mar. 25, 2014

(54) OUTPUT CIRCUIT

(75) Inventors: Akiyoshi Matsuda, Kasugai (JP); Akihiro Suzuki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 25 days.

(21) Appl. No.: 13/585,281

(22) Filed: Aug. 14, 2012

(65) Prior Publication Data

US 2013/0043947 A1    Feb. 21, 2013

(30) Foreign Application Priority Data

Aug. 16, 2011 (JP) ................................. 2011-178007

(51) Int. Cl.
*H03F 3/45* (2006.01)

(52) U.S. Cl.
USPC ............................................. 330/253; 330/51

(58) Field of Classification Search
USPC ....................... 330/253, 261, 51, 69
See application file for complete search history.

(56) References Cited

U.S. PATENT DOCUMENTS

| | | | | |
|---|---|---|---|---|
| 5,297,092 A | * | 3/1994 | Johnson | 365/203 |
| 5,589,785 A | * | 12/1996 | Garavan | 327/63 |
| 8,030,999 B2 | * | 10/2011 | Chatterjee et al. | 330/253 |
| 8,149,064 B2 | * | 4/2012 | Paul et al. | 330/310 |

FOREIGN PATENT DOCUMENTS

JP    2003-152523 A    5/2003

* cited by examiner

*Primary Examiner* — Henry Choe
(74) *Attorney, Agent, or Firm* — Arent Fox LLP (57) ABSTRACT

An output circuit includes first to fourth transistors, first and second constant current units, and a differential pair. The gates of the first and second transistors are supplied with two input signals, respectively. The drain of the first transistor is coupled to the drain of the third transistor and the gate of the fourth transistor. The drain of the second transistor is coupled to the gate of the third transistor and the drain of the fourth transistor. The first constant current unit is coupled to the sources of the third and fourth transistors. The differential pair includes two transistors, and the gates of the two transistors are coupled to the drains of the first and second transistors, respectively. The second constant current unit is coupled to the sources of the two transistors. Two output signals are output from two nodes respectively corresponding to the drains of the two transistors.

9 Claims, 7 Drawing Sheets

OUTPUT CIRCUIT

CROSS-REFERENCE TO RELATED APPLICATIONS

This application is based upon and claims the benefit of priority from prior Japanese Patent Application No. 2011-178007, filed on Aug. 16, 2011, the entire contents of which are incorporated herein by reference.

FIELD

This disclosure relates to an output circuit.

BACKGROUND

Differential amplifiers are being utilized in a wide field of application. For example, complementary signals are used in communication between electronic devices. Accordingly, a communication interface circuit, which is arranged in an electronic device, has a driver circuit that includes a differential amplifier to output complementary signals in response to complementary input signals. Japanese Laid-Open Patent Publication No. 2003-152523 describes an example of such a driver circuit.

Figure 7:
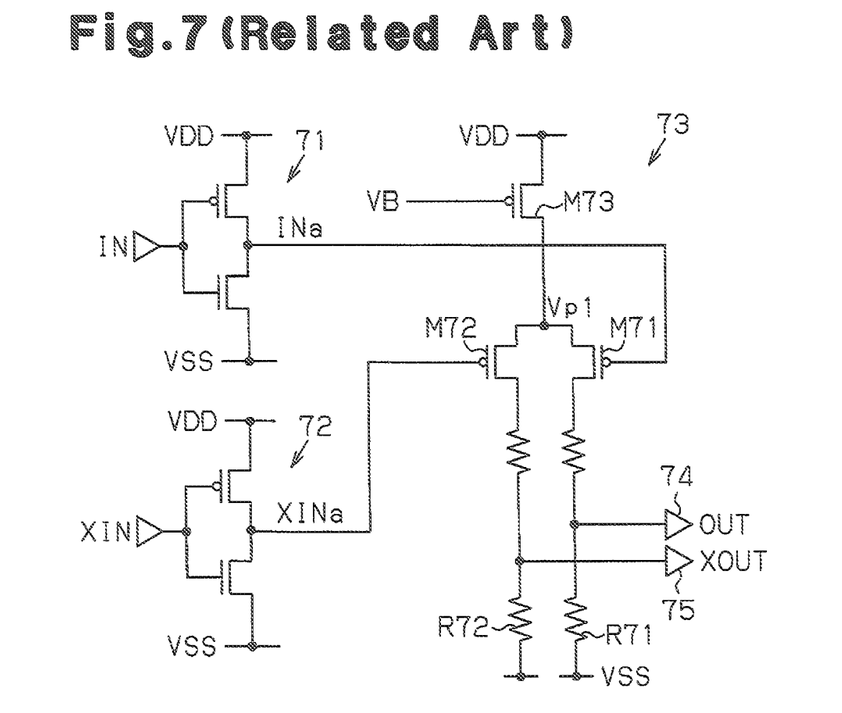
FIG. 7 is a circuit diagram of a driver circuit in the related art.

As illustrated in FIG. 7, for example, the differential amplifier included in the driver circuit has inverters 71 and 72 and a differential current output driver 73. The inverters 71 and 72 receive complementary input signals IN and XIN, respectively. The differential current output driver 73 responds to output signals INa and XINa from the inverters 71 and 72. The differential current output driver 73 includes input transistors M71 and M72 which are activated and deactivated in a complementary manner in response to the input signals IN and XIN respectively. For example, when the input transistor M71 is activated to supply its drain current via an output terminal 74 to a signal wiring (cable), a terminating resistor R72 coupled to the input transistor M72, which is deactivated, terminates a signal wiring (cable) coupled to an output terminal 75. When the input transistor M72 is activated to supply its drain current via the output terminal 75 to the signal wiring (cable), a terminating resistor R71 coupled to the input transistor M71, which is deactivated, terminates the signal wiring (cable) coupled to the output terminal 74. In such a manner, the differential amplifier generates complementary output signals OUT and XOUT.

Figure 8:
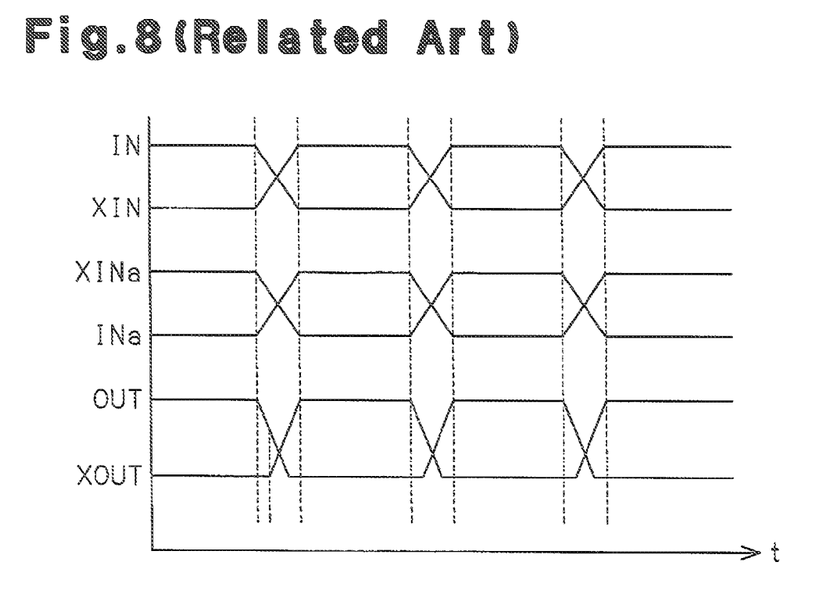
FIG. 8 is an operation waveform diagram of the driver circuit of FIG. 7.

As illustrated in FIG. 8, in the differential amplifier illustrated in FIG. 7, there occurs a difference in transition timing between an output signal OUT and an inverted output signal XOUT. For example, the rising timing of the inverted output signal XOUT is delayed with respect to the falling timing of the output signal OUT. Further, since the output signals OUT and XOUT are complementary to each other, the rising timing of the output signal OUT is also delayed with respect to the failing timing of the inverted output signal XOUT.

Figure 9:
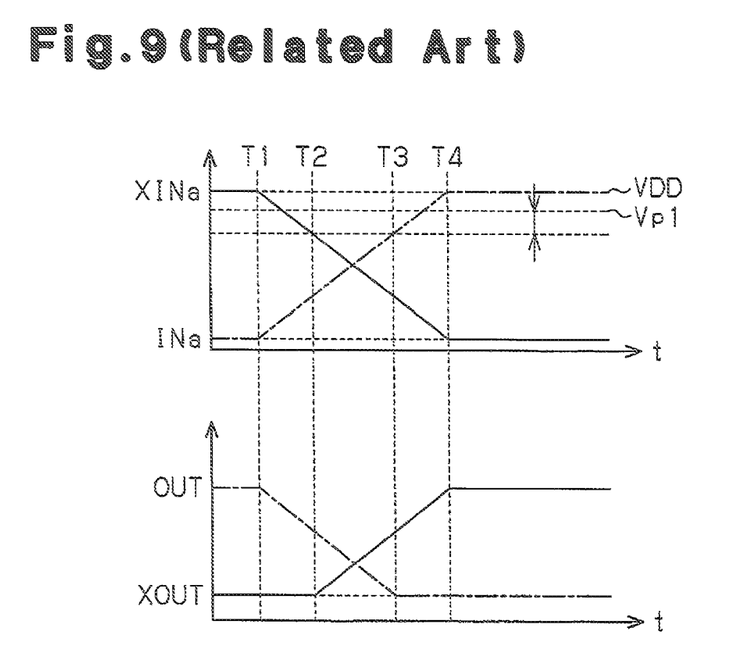
FIG. 9 is an operation waveform diagram of the driver circuit of FIG. 7.

As illustrated in FIG. 9, when the internal signal INa rises at time T1, the on-resistance of the input transistor M71 that receives the internal signal INa increases. This decreases a current flowing through the input transistor M71 and lowers the output signal OUT. Further, the internal signal XINa falls at time T1. When the voltage of the internal signal XINa supplied to the gate of the input transistor M72 is lowered below a voltage obtained by subtracting a total sum of the source-drain voltage of a constant current transistor M73 and the threshold voltage Vth of the input transistor M72 from a high potential voltage VDD, the input transistor M72 is activated (time T2). Then, a current flows to the resistor R72 via the activated input transistor M72 to raise the inverted output signal XOUT. In such a manner, the input transistors M71 and M72 are activated and deactivated at different timings.

Thus, with respect to the timing at which one of the output signals OUT and XOUT changes in potential from the high level to the low level, the timing at which the other of the output signals OUT and XOUT changes in potential from the low level to the high level is delayed. Therefore, due to the delay (that is, skew) in timing between the complementary output signals OUT and XOUT, the cross-point of the output signals OUT and XOUT shifts from the midpoint amplitude of each of these signals OUT and XOUT. Such a shift in cross-point of the output signals OUT and XOUT from the midpoint amplitude deteriorates the quality of data to be transmitted.

SUMMARY

According to one aspect, an output circuit includes a first transistor, a second transistor, a third transistor, a fourth transistor, a first constant current unit, a differential pair, and a second constant current unit. The first transistor includes a gate, a source, and a drain, the gate of the first transistor supplied with one of two input signals. The second transistor includes a gate, a source, and a drain, the gate of the second transistor supplied with the other of the two input signals. The third transistor includes a drain coupled to the drain of the first transistor, a gate coupled to the drain of the second transistor, and a source. The fourth transistor includes a gate coupled to the drain of the first transistor, a drain coupled to the drain of the second transistor, and a source. The first constant current unit is coupled to the source of the third transistor and the source of the fourth transistor. The differential pair includes two transistors, the two transistors of the differential pair each including a gate, a source, and a drain. The gate of one of the two transistors of the differential pair is coupled to the drain of the first transistor, and the gate of the other of the two transistors of the differential pair is coupled to the drain of the second transistor. The second constant current unit is coupled to the sources of the two transistors of the differential pair. Two output signals are output from two nodes respectively corresponding to the drains of the two transistors of the differential pair.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

it is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which.

DESCRIPTION OF THE EMBODIMENTS

The embodiments will now be described with reference to the drawings.

Figure 1:
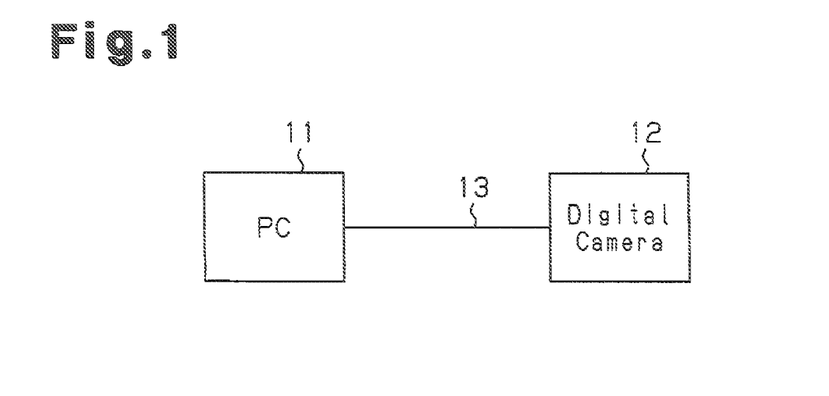
FIG. 1 is a schematic diagram of a data transfer system.

As illustrated in FIG. 1, a data transfer system includes a personal computer (PC) 11 and a digital camera 12. The personal computer 11 and the digital camera 12 are coupled to each other with a cable 13. As the cable 13, a cable compatible with an interface used for data transfer, for example, a USB cable is used. The digital camera 12 includes a driver circuit for data transfer. The driver circuit may include, for example, a differential amplifier. Transfer data, for example, image data is transferred from the digital camera 12 via the cable 13 to the personal computer 11.

Figure 2:
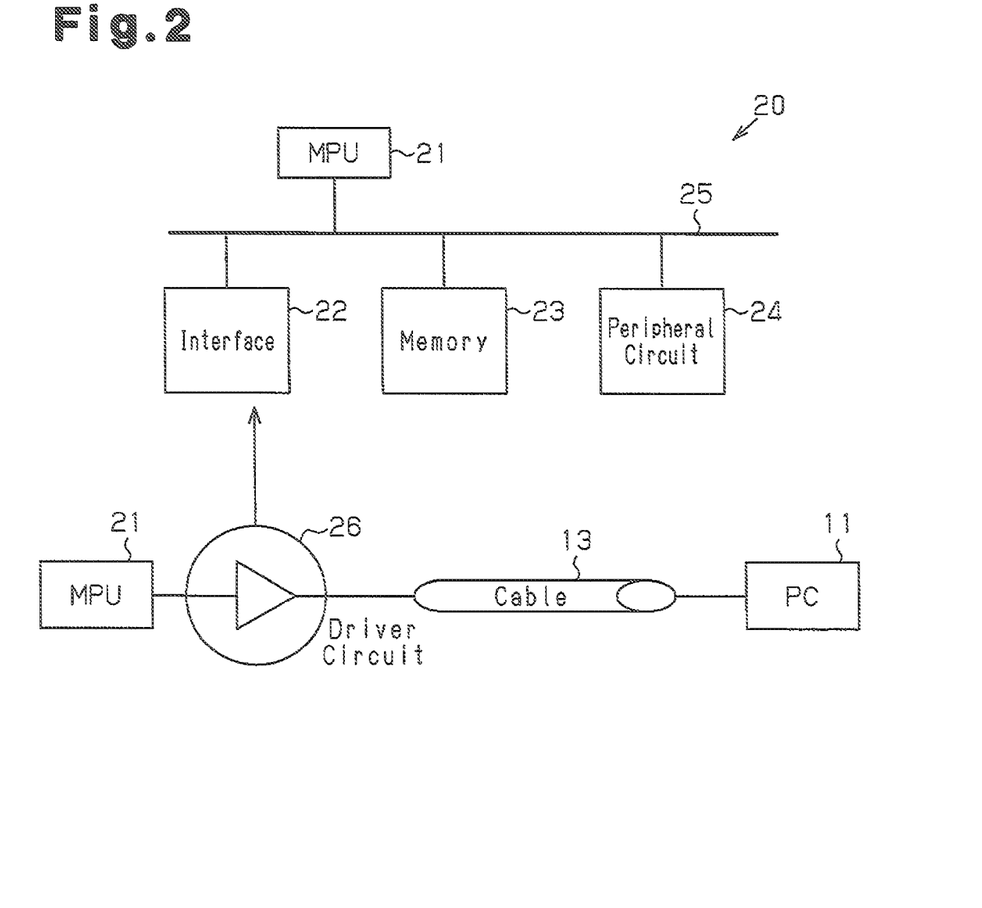
FIG. 2 is a schematic block diagram of a semiconductor device.

As illustrated in FIG. 2, a semiconductor device 20 built in the digital camera 12 includes a microprocessor (MPU) 21 for conducting overall control, an interface 22, a memory (random access memory (RAM)) 23, and a peripheral circuit 24, which are coupled to each other with a bus 25. The peripheral circuit 24 includes a circuit which performs focus control for imaging, image processing such as color correction, data conversion processing for converting picked-up image data into image data in a given format (for example, joint photographic experts group (PEG)), and the like. The generated image data is stored in a storage device not illustrated. The storage device is, for example, a hard disk drive (HDD) or a nonvolatile memory. The interface 22 includes a driver circuit 26. The driver circuit 26 outputs the image data under the control of the MPU 21. The image data is transferred via the cable 13 to the personal computer 11.

Next, a configuration example of the differential amplifier (output circuit) will now be described.

First Embodiment

A first embodiment of the differential amplifier will now be described with reference to FIGS. 3 and 4.

Figure 3:
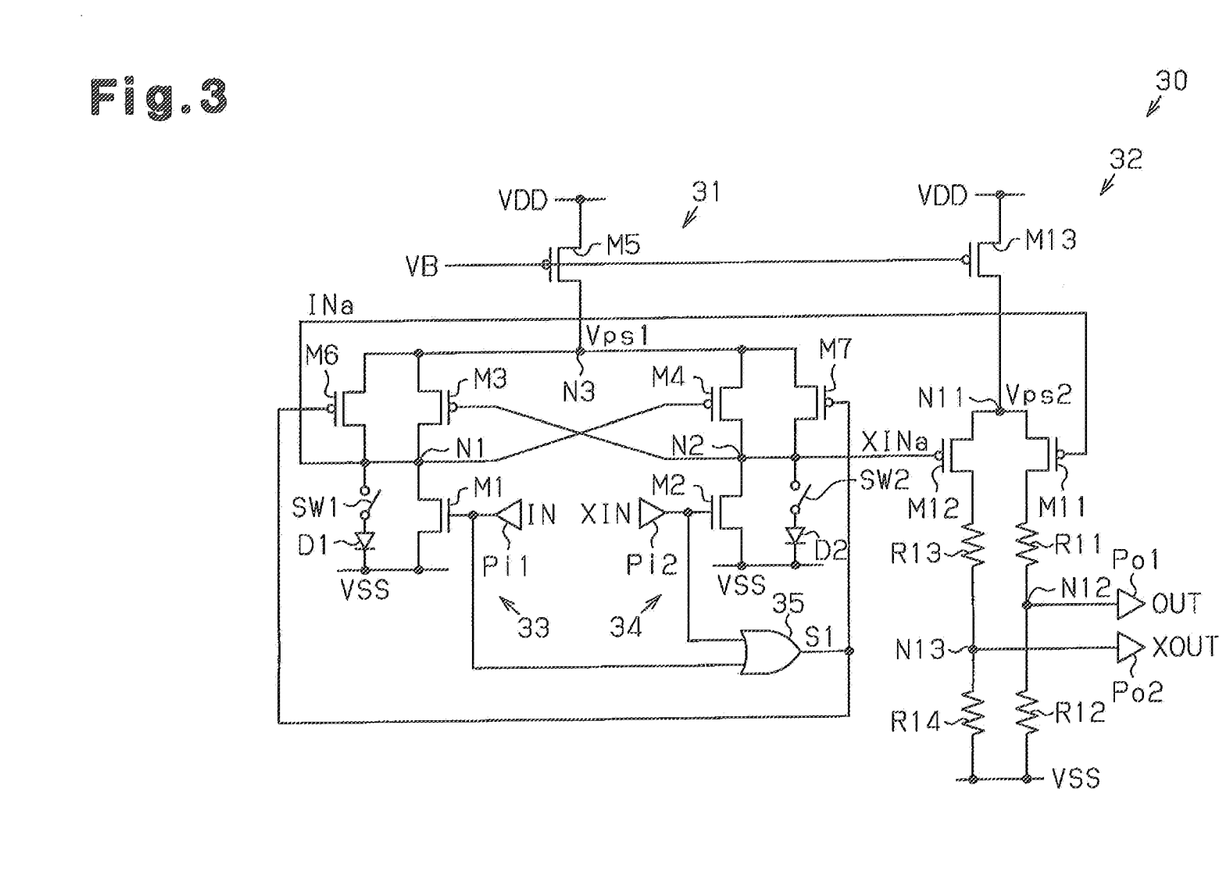
FIG. 3 is a circuit diagram of a differential amplifier according to a first embodiment.

As illustrated in FIG. 3, a differential amplifier 30 includes an input unit 31 and a differential unit 32. The input unit 31 generates complementary internal signals INa and XINa based on complementary input signals IN and XIN supplied to input terminals Pi1 and Pi2, respectively.

The input signal IN is supplied to the gate of a transistor M1, and the inverted input signal XIN is supplied to the gate of a transistor M2. The source of the transistor M1 is coupled to a wiring supplied with a low potential voltage VSS. In the following description, the wiring supplied with the low potential voltage VSS is referred to as the wiring VSS based on the voltage. This also applies with respect to wirings supplied with other voltages. The drain of the transistor M1 is coupled to the drain of a transistor M3.

The source of the transistor M2 is coupled to the wiring VSS, and the drain of the transistor M2 is coupled to the drain of a transistor M4. A node N1 between the drain of the transistor M1 and the drain of the transistor M3 serves as an output node of a first inverter 33 and is coupled to the gate of the transistor M4. A node N2 between the drain of the transistor M2 and the drain of the transistor M4 serves as an output node of a second inverter 34 and is coupled to the gate of the transistor M3.

The transistors M1 and M3 operate as the first inverter 33 which receives the input signal IN. Further, the transistors M2 and M4 operate as the second inverter 34 which receives the inverted input signal XIN. The first inverter 33 and the second inverter 34 are cross-coupled to each other.

A node N3 between the source of the transistor M3 and the source of the transistor M4 is coupled to a transistor M5. The transistor M5 is, for example, a p-channel MOS transistor. The drain of the transistor M5 is coupled to the node N3. The source of the transistor MS is coupled to a wiring supplied with a high potential voltage VDD (hereinafter referred to as the wiring VDD). The gate of the transistor M5 is supplied with a bias voltage VB. The transistor M5 operates as a constant current source that supplies a drain current according to the bias voltage VB. The transistor M5 is one example of a first constant current unit. The transistor M5 sets a voltage Vps1 at the node N3 to a value lower than the high potential voltage VDD by a source-drain voltage of the transistor M5 according to the bias voltage VB.

Further, the input unit 31 includes transistors M6 and M7 and an OR gate 35. The OR gate 35 is supplied with the complementary input signals IN and XIN. An output terminal of the OR gate 35 is coupled to the gates of the transistors M6 and M7. The transistors M6 and M7 are each, for example, a p-channel MOS transistor. The transistor M6 is coupled in parallel with the transistor M3 of the inverter 33. The transistor M7 is coupled in parallel with the transistor M4 of the inverter 34. That is, the source and the drain of the transistor M6 are respectively coupled to the source and the drain of the transistor M3, and the source and the drain of the transistor M7 are respectively coupled to the source and the drain of the transistor M4.

The OR gate 35 outputs a control signal S1 having a low level (L level) when the input signals IN and XIN are both at a low level (L level) and outputs the control signal S1 having a high level (H level) when at least one of the input signals IN and XIN is at a high level (H level). The control signal S1 is supplied to the gates of the transistors M6 and M7. The transistors M6 and M7 are deactivated in response to the control signal S1 of the H level and activated in response to the control signal S1 of the L level. The activated transistor M6 couples the source and the drain of the transistor M3. Similarly, the activated transistor M7 couples the source and the drain of the transistor M4. Therefore, when the input signals IN and XIN are both at the L level, the potential of each of the output nodes N1 and N2 of the inverters 33 and 34 is equal to the potential at the node N3. That is, in response to the input signals IN and XIN having the L level, the OR gate 35 and the transistors M6 and M7 set the potentials of the internal signals INa and XINa to be equal to the potential of the node N3. The OR gate 35 is one example of a signal generation circuit.

Further, the input unit 31 includes switches SW1 and SW2 and diodes D1 and D2. The switch SW1 includes a first terminal coupled to the node N1 and a second terminal coupled to an anode of the diode D1. A cathode of the diode D1 is coupled to the wiring VSS. Similarly, the switch SW2 includes a first terminal coupled to the node N2 and a second terminal coupled to an anode of the diode D2. A cathode of the diode D2 is coupled to the wiring VSS. The diodes D1 and D2 are formed to have similar electric characteristics.

The switches SW1 and SW2 are turned on and off, for example, in response to a control signal supplied from an MPU21 illustrated in FIG. 2. For example, the MPU21 outputs the control signal having a first level (for example, a high level) in a data transfer period, and outputs the control signal having a second level (for example, a low level) different from the first level in a period not for data transfer. The switches SW1 and SW2 are turned on in response to the control signal of the first level and turned off in response to the control signal of the second level.

When the switch SW1 is turned on, the anode of the diode D1 is coupled to the node N1. When the transistor M1 is in the deactivated state, the diode D1 clamps the voltage at the node N1, that is, a level of the internal signal INa to a potential higher than the low potential voltage VSS by a threshold voltage (forward voltage) Vd1 of the diode D1. When the transistor M1 is activated, the voltage of the node N1 becomes equal to the low potential voltage VSS. Thus, when the switch SW1 is in the on-state, the internal signal INa shifts in a range from the low potential voltage VSS to the threshold voltage Vd1 of the diode D1. When the switch SW1 is in the off-state and the transistor M1 is in the deactivated state, the voltage at the node N1 is set to a level of the high potential voltage VDD by the transistors M3 and MS. Accordingly, when the switch SW1 is in the on-state, the switch SW1 and the diode D1 restrict a range of the voltage generated at the node N1, that is, the amplitude of the internal signal INa.

Similarly, when the switch SW2 is turned on, the diode D2 clamps the voltage at the node N2, that is, a level of the inverted internal signal XINa to a potential higher than the low potential voltage VSS by a threshold voltage (forward voltage) Vd2 of the diode D2. Accordingly, when the switch SW2 is in the on-state, the switch SW2 and the diode D2 restrict a range of the voltage generated at the node N2, that is, the amplitude of the inverted internal signal XINa.

The nodes N1 and N2 are coupled to the differential unit 32. The differential unit 32 is supplied with the internal signal INa having the voltage of the node N1 and the inverted internal signal XINa having the voltage of the node N2.

The differential unit 32 includes a transistor M11 with its gate supplied with the internal signal INa and a transistor M12 with its gate supplied with the inverted internal signal XINa. The transistors M11 and M12 are each, for example, a p-channel MOS transistor. The transistors M11 and M12 serve as a differential pair. The sources of the transistors M11 and M12 are coupled to each other. A node N11 between the sources of the transistors M11 and M12 is coupled to a transistor M13.

The transistor M13 is, for example, a p-channel MOS transistor. The transistor M13 includes a drain coupled to the node N11, a source coupled to the wiring VDD, and a gate supplied with the bias voltage VB. The transistor M13 operates as a constant current source that supplies a drain current according to the bias voltage VB. The transistor M13 is one example of a second constant current unit. A voltage Vps2 at the node N11 is set to a value lower than the high potential voltage VDD by a source-drain voltage of the transistor M13 according to the bias voltage VB.

The drain of the transistor M11 is coupled to the wiring VSS via resistors R11 and R12. The drain of the transistor M12 is coupled to the wiring VSS via resistors R13 and R14. A node N12 between the resistors R11 and R12 is output to an output terminal Po1, and a node N13 between the resistors R13 and R14 is coupled to an output terminal Po2.

The transistors arranged in pairs in the input unit 31 are formed in a shape to have similar electric characteristics. For example, the transistor M1 of the inverter 33 and the transistor M2 of the inverter 34 are formed to have similar electric characteristics. In this case, for example, a gate length and a gate width of the transistor M1 are set to be equal to a gate length and a gate width of the transistor M2, respectively. Similarly, the transistor M3 of the inverter 33 and the transistor M4 of the inverter 34 are formed to have similar electric characteristics. Similarly, the transistors arranged in pairs in the differential unit 32 are formed in a shape to have similar electric characteristics. For example, the transistor M11, which receives the internal signal Ina, and the transistor M12, which receives the inverted internal signal XINa, are formed to have similar electric characteristics.

In the input unit 31, the transistor M5 supplies current to the inverters 33 and 34. In the differential unit 32, the transistor M13 supplies current to the transistors M11 and M12. Further, the transistor M13 of the differential unit 32 supplies the current proportional to that supplied by the transistor M5 of the input unit 31. For example, the transistors M5 and M13 are formed so that a ratio (current ratio) of the magnitude of the current flowing through the transistor M5 to the magnitude of the current flowing through the transistor M13 is 1:6.

The current ratio of the transistor M5 to the transistor M13 is set by, for example, the number of transistors coupled in parallel. For example, the transistor M13 includes six transistors (first unit transistors) which are formed in a shape similar to the transistor M5 and coupled in parallel with each other. The transistor M5 has a gate length and gate width similar to that of each of the first unit transistors. In other words, the transistor M5 has the electric characteristics (e.g., threshold voltage) similar to those of each of the first unit transistors. In this manner, the current ratio of the transistor M5 to the transistor M13 is set to a given value (1:6 in this case).

Similarly, in the differential amplifier 30, the transistors that are supplied with the same signal at their respective gates are set to have a similar current ratio to that between the transistors M5 and M13. For example, in the transistors M4 and M11 that are supplied with the internal signal INa at their respective gates, the current ratio of the transistor M4 to the transistor M11 is set to the given value (1:6). In this case, for example, the transistor M11 includes six transistors (second unit transistors) which are formed in a shape similar to the transistor M4 and coupled in parallel with each other. Thus, the transistors M4 and M11 are formed to have a similar threshold voltage and supply currents at the given ratio (1:6).

Similarly, in the transistors M3 and M12 that are supplied with the inverted internal signal XINa at their respective gates, the current ratio of the transistor M3 to the transistor M12 is set to the given value (1:6). In this case, for example, the transistor M12 includes six transistors (third unit transistors, which may be the same as the second unit transistors) which are formed in a shape similar to the transistor M3 and coupled in parallel with each other. Thus, the transistors M3 and M12 are formed to have a similar threshold voltage and supply currents at the given ratio (1:6).

As described above, the current ratio of the transistor M5 to the transistor M13 is equal to the current ratio of the transistor M4 to the transistor M11 as well as to the current ratio of the transistor M3 to the transistor M12. In the present example, a ratio of the number of the transistor M5 to the number of the transistor M13, a ratio of the number of the transistor M4 to the number of the transistor M11, and a ratio of the number of the transistor M3 to the number of the transistor 12 are equal to each other. Further, the threshold voltages of the transistors M3 and M4 are equal to those of the transistors M11 and M12. Therefore, the voltage Vps1 at the node N3 is equal to the voltage Vps2 at the node N11.

Further, the transistors M4 and M11 are supplied with the internal signal INa at their respective gates. The transistors M3 and M12 are supplied with the inverted internal signal XINa at their respective gates. Therefore, the transistors M4 and M11 are activated at substantially the same timing in response to the internal signal INa. Similarly, the transistors M3 and M12 are activated at substantially the same timing in response to the inverted internal signal XINa.

Next, the operation of the differential amplifier 30 will now be described.

Figure 4:
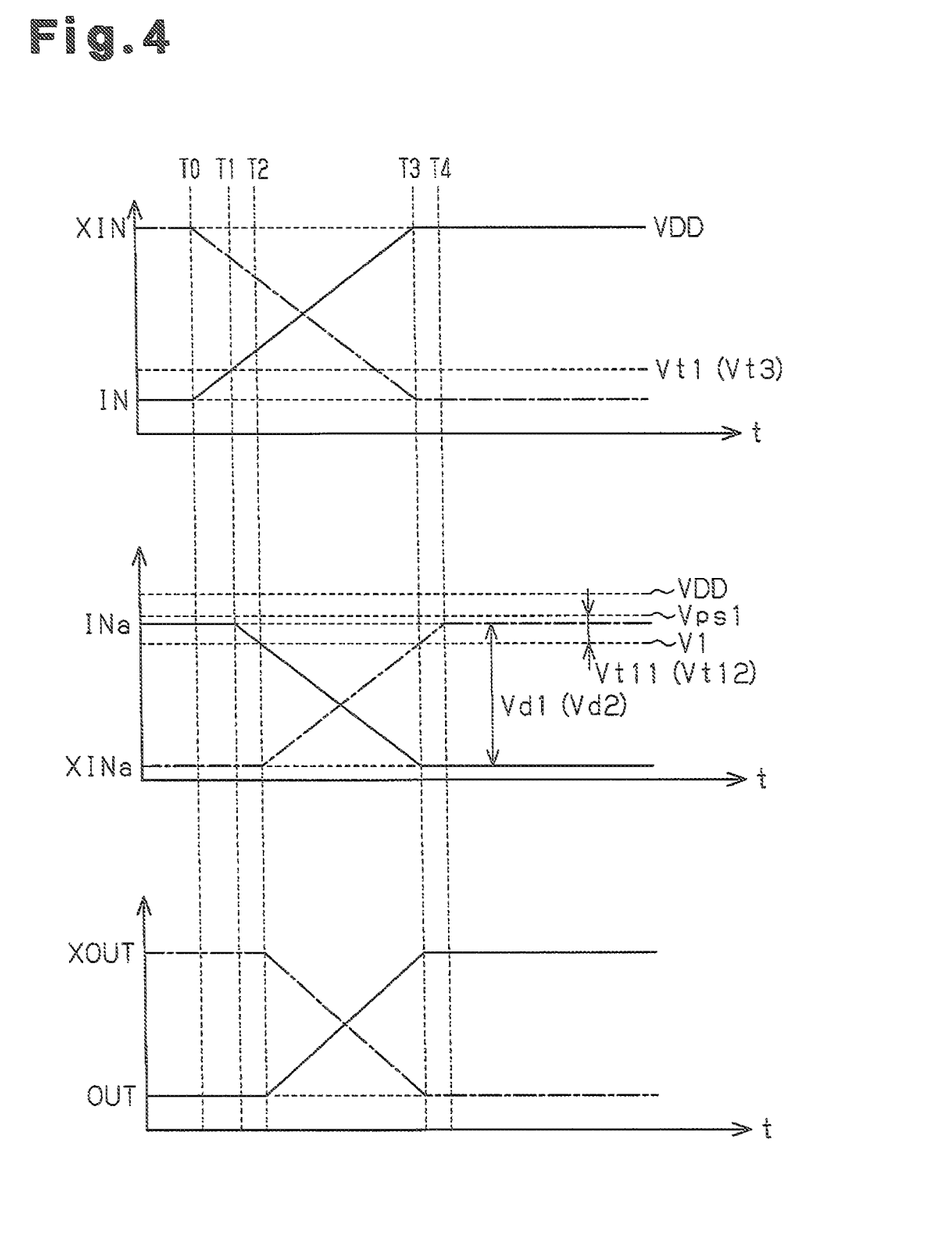
FIG. 4 is an operation waveform diagram of the differential amplifier of the FIG. 3.

As illustrated in FIG. 4, the input signal IN having the L level (level of the low potential voltage VSS) and the inverted input signal XIN having the H level (level of the high potential voltage VDD) are supplied to the differential amplifier 30. In this case, in FIG. 3, the transistor M1 is deactivated in response to the input signal IN of the L level and the transistor M2 is activated in response to the inverted input signal XIN of the H level. As a result, as illustrated in FIG. 4, the internal signal INa has a potential higher than the low potential voltage VSS by the threshold voltage Vd1 of the diode D1, and the inverted internal signal XINa has the L level (level of the low potential voltage VSS).

At time T0, the input signal IN starts rising and the inverted input signal XIN starts falling.

Subsequently, when the input signal IN exceeds a threshold voltage Vt1 of the transistor M1 (time T1), the transistor M1 is activated. This lowers the internal signal INa.

When the internal signal INa is lowered below a voltage V1 lower than the voltage Vps1 of the node N3 by a threshold voltage Vt11 of the transistor M11 (time T2), the transistor M11 is activated. Thus, a current flows to the resistors R11 and R12 via the activated transistor M11. This increases the voltage of the output signal OUT In this case, the internal signal INa is supplied to the gate of the transistor M4, whose threshold is equal to that of the transistor M11. Therefore, the transistor M4 is also activated. Thus, a current flowing through the activated transistor M4 increases the potential at the node N2, that is, the voltage of the inverted internal signal XINa. The inverted internal signal XINa is supplied to the gate of the transistor M12 in the differential unit 32. Thus, a current flowing through the resistors R13 and R14 via the transistor M12 starts decreasing to lower the voltage of the inverted output signal XOUT.

In such a manner, at time T2, the voltage of the output signal OUT starts to increase and the voltage of the inverted output signal XOUT starts to decrease. That is, the timing at which the output signal OUT changes coincides with the timing at which the inverted output signal XOUT changes.

Subsequently, when the inverted internal signal XINa exceeds the voltage V1 (time T3), the transistor M12 is deactivated. Thus, the inverted output signal XOUT is kept at the level of the low potential voltage VSS. The inverted internal signal XINa is supplied to the gate of the transistor M3. Therefore, the transistor M3 is deactivated. This keeps the internal signal INa at the level of the low potential voltage VSS. Thus, the gate voltage of the transistor M11 does not decrease any more. That is, the magnitude of the current flowing to the transistor M11 does not change. Further, at time T3, the transistor M12 is already deactivated. Thus, even if the gate voltage of the transistor M12 further increases, the transistor M12 is kept in the deactivated state. Therefore, the magnitude of the current flowing to the transistor M12 does not change, having no influence on the magnitude of the current flowing to the transistor M11. Accordingly, the voltage of the output signal OUT does not increase anymore. Therefore, at substantially the same timing, rising of the output signal OUT and falling of the inverted output signal XOUT are stopped. That is, the output signal OUT and the inverted output signal XOUT are kept to stable levels at substantially the same timing.

Subsequently, when the inverted internal signal XINa exceeds a voltage higher than the low potential voltage VSS by the threshold voltage Vd2 of the diode D2 (time T4), the diode D2 is activated. Thus, the diode D2 damps the inverted internal signal XINa to the voltage higher than the low potential voltage VSS by the threshold voltage Vd2.

Hereinabove, the case where the input signal IN changes from the L level to the H level (in other words, the inverted input signal XIN changes from the H level to the L level) has been described. A similar operation is performed with respect to the case where the inverted input signal XIN changes from the L level to the H level (in other words, the input signal IN changes from the H level to the L level), and the figures and the description will be omitted.

In such a manner, the differential amplifier 30 causes the timing at which the output signal OUT is changed with respect to a change in the input signal IN to coincide with the timing at which the inverted output signal XOUT is changed with respect to a change in the inverted input signal XIN. As a result, a voltage at which the potential of the output signal OUT and the potential of the inverted output signal XOUT are equal to each other, that is, a cross-point voltage of the waveform of the output signal OUT and the waveform of the inverted output signal XOUT is set to a midpoint voltage of each of the amplitudes of the output signals OUT and XOUT.

The output circuit of the first embodiment has the following advantages.

(1) The input signals IN and XIN are supplied to the gates of the transistors M1 and M2, respectively. The drain of the transistor M1 is coupled to the drain of the transistor M3 and the gate of the transistor M4, and the drain of the transistor M2 is coupled to the gate of the transistor M3 and the drain of the transistor M4. Further, the drains of the transistors M1 and M2 are respectively coupled to the gates of the transistors M11 and M12 that serve as a differential pair. The sources of the transistors M3 and M4 are coupled to the transistor M5 whose gate is supplied with the bias voltage VB. The sources of the transistors M11 and M12 are coupled to the transistor M13 whose gate is supplied with the bias voltage VB.

When the input signal IN exceeds the threshold voltage Vt1 of the transistor M1, the transistor M1 is activated. This lowers the voltage of the internal signal INa. When the voltage of the internal signal INa is lowered below the voltage V1 lower than the voltage Vps1 of the node N3 by the threshold voltage Vt11 of the transistor M11, the transistor M11 is activated. Thus, a current flows to the resistors R11 and R12 via the activated transistor M11. As a result, the voltage of the output signal OUT is increased. Further, in response to the internal signal INa, the transistor M4 is activated so that the voltage of the inverted internal signal XINa is increased. The increase in the inverted internal signal XINa decreases a current flowing via the transistor M12 to the resistors R13 and R14. Accordingly, the voltage of the inverted output signal XOUT is decreased.

In such a manner, the differential amplifier 30 causes the timing at which the output signal OUT is changed with respect to a change in the input signal IN to coincide with the timing at which the inverted output signal XOUT is changed with respect to a change in the inverted input signal XIN. In other words, the shift in timing between the output signals OUT and XOUT is suppressed. Thus, a voltage at which the potentials of the output signals OUT and XOUT are equal to each other (that is, voltage at a cross-point between the waveform of the output signal OUT and the waveform of the inverted output signal XOUT) may be set to a midpoint voltage of each of the amplitudes of the output signals OUT and XOUT.

(2) When the input signals IN and XIN are both at the L level, the OR gate 35 and the transistors M6 and M7 set the potential of each of the internal signals INa and XINa to the potential at the node N3. This prevents the internal signals INa and XINa from becoming indefinite when the input signals IN and XIN are both at the L level. Further, the potential of the node N3 is equal to that of the node N11. Thus, the transistors M11 and M12 are deactivated by the internal signals INa and XINa which are at the source voltage Vps2. Therefore, the output signals OUT and XOUT are both kept at the L level (level of the low potential voltage VSS) when the input signals IN and XIN are both at the L level.

(3) The switch SW1 and the diode D1 are coupled in series between the drain and source terminals of the transistor M1 whose gate is supplied with the input signal IN. Similarly, the switch SW2 and the diode D2 are coupled in series between the drain and source terminals of the transistor M2 whose gate is supplied with the inverted input signal XIN. Thus, the internal signal INa is lowered from a voltage higher than the low potential voltage VSS by the threshold voltage Vd1 (forward voltages) of the diode D1, and the inverted internal signal XINa is lowered from a voltage higher than the low potential voltage VSS by the threshold voltage Vd2 (forward voltages) of the diode D2. If the diodes D1 and D2 are omitted, the internal signals INa and XINa each take on the level of the high potential voltage VDD. Thus, as compared to the case where the internal signals INa and XINa are lowered from the high potential voltage VDD, the internal signals INa and XINa are lowered below the voltage V1 illustrated in FIG. 4 speedily. That is, it takes less time to activate the transistors M11 and M12. As a result, data may be transferred more speedily.

(4) The switches SW1 and SW2 are coupled in series with the diodes D1 and D2 respectively. Therefore, by turning off the switches SW1 and SW2, currents do not flow through the diodes D1 and D2, respectively. This reduces the consumption current in the differential amplifier 30.

(5) The diodes D1 and D2 restrict the amplitudes of the internal signals INa and XINa, respectively. The larger amplitude takes more time to change to a given level. In this case, when the input signals INa and XINa are inverted at a short cycle, there may be a case where before the internal signals INa and XINa reach, for example, the high potential voltage VDD, the next change would start, possibly resulting in intersymbol interference. Therefore, by restricting the amplitudes of the internal signals INa and XINa, the intersymbol interference in data transfer may be prevented.

Second Embodiment

Figure 5:
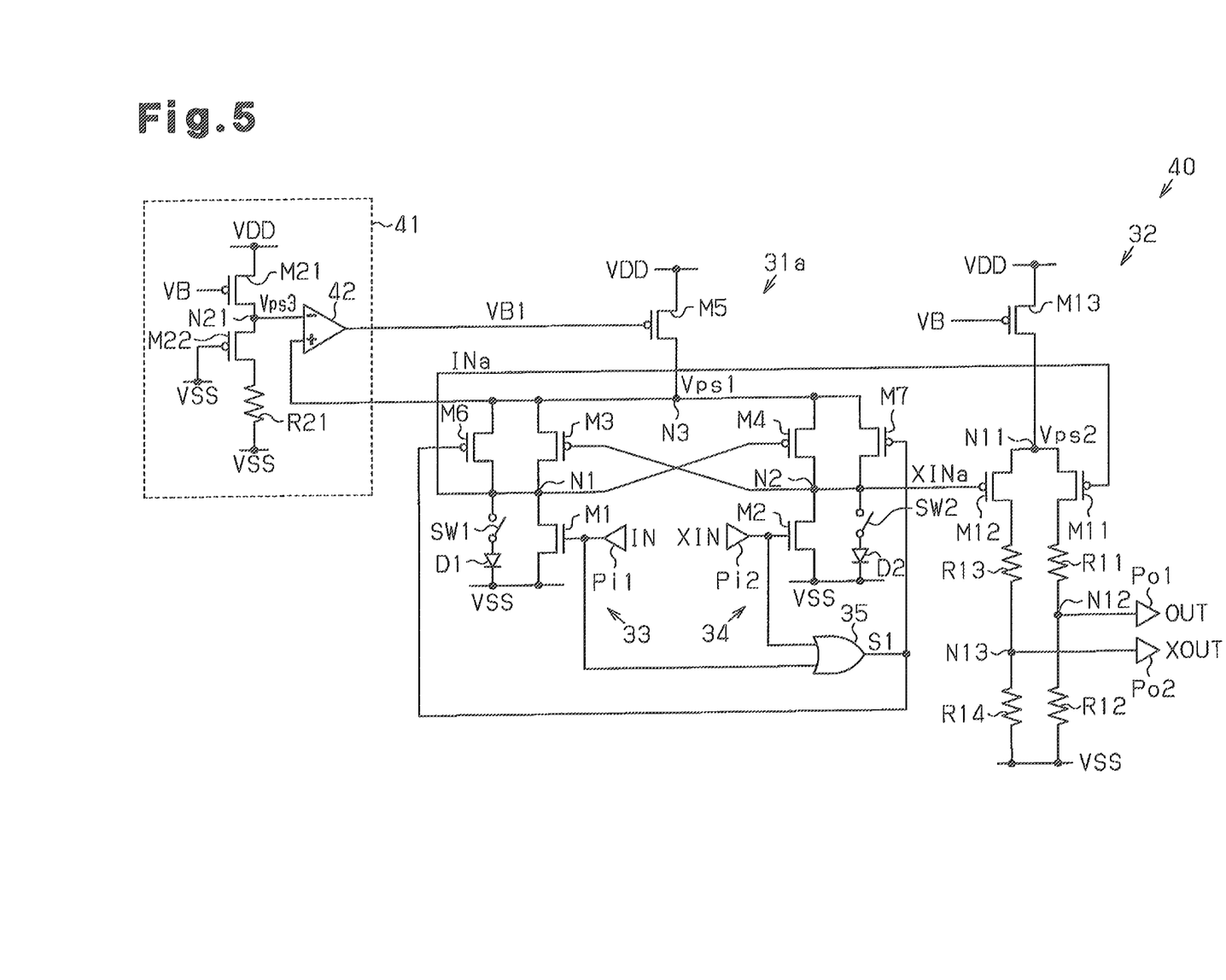
FIG. 5 is a circuit diagram of a differential amplifier according to a second embodiment.

The following will describe a second embodiment with reference to FIG. 5. Identical reference numerals are given to identical components in the first and second embodiments, and repetitive description on the identical components will be omitted partially or totally.

As illustrated in FIG. 5, a differential amplifier 40 includes an input unit 31a, a differential unit 32, and a bias voltage control unit 41.

The gate and the drain of a transistor M5 in the input unit 31a are coupled to the bias voltage control unit 41.

The bias voltage control unit 41 includes transistors M21 and M22, a resistor R21, and an operational amplifier 42. The transistors M21 and M22 are each, for example, a p-channel MOS transistor. The transistor M21 has a source coupled to the wiring VDD, a drain coupled to the source of the transistor M22, and a gate supplied with the bias voltage VB. The resistor R21 has a first terminal coupled to the drain of the transistor M22 and a second terminal coupled to the wiring VSS. The gate of the transistor M22 is coupled to the wiring VSS.

A node N21 between the transistors M21 and M22 is coupled to an inverting input terminal of the operational amplifier 42. A non-inverting input terminal of the operational amplifier 42 is coupled to a node N3 in the input unit 31a, that is, the drain of the transistor M5. An output terminal of the operational amplifier 42 is coupled to the gate of the transistor M5.

The transistor M21, the transistor M22, and the resistor R21 which are arranged in the bias voltage control unit 41, are formed respectively in correspondence with the transistor M13, the transistor M11 (M12), and the resistors R11 and R12 (R13 and R14), which are arranged in the differential unit 32. For example, the transistor M21 is formed to supply current of which the magnitude is equal to that of current supplied by the transistor 113, and the transistor M22 is formed to supply current of which the magnitude is equal to that of current supplied by the transistor M11 (M12). The resistor R21 is formed to have a resistance value that is equal to a combined resistance value of the resistors R11 and R12. The transistors M21 and M22 and the resistor R21 are used to set the voltage Vps2 at the node N11 in the differential unit 32 to be equal to a reference voltage Vps3 at a node N21 between the transistors M21 and M22.

The operational amplifier 42 generates a bias voltage VB1 to make voltages at the two input terminals equal to each other. In this embodiment, the operational amplifier 42 generates the bias voltage VB1 so that the drain voltage of the transistor M5, that is, the voltage Vps1 of the node N3 becomes equal to the reference voltage Vps3 generated at the node N21 based on the bias voltage VB. Here, the reference voltage Vps3 generated at the node N21 is equal to the voltage Vps2 of the node N11 in the differential unit 32. Accordingly, the operational amplifier 42 generates the bias voltage VB1 so that the voltage Vps1 of the node N3 in the input unit 31a becomes equal to the voltage Vps2 of the node N11 in the differential unit 32.

The output circuit of the second embodiment has the following advantages in addition to those of the first embodiment.

(6) The bias voltage control unit 41 generates the reference voltage Vps3 based on the bias voltage VB by using the transistors M21 and M22 and the resistor R21. Then, the bias voltage control unit 41 controls the transistor M5 so that the voltage Vps1 of the node N3, that is, the source voltage of each of the transistors M3 and M4 is equal to the reference voltage Vps3. Therefore, the voltage Vps2 of the node N11 in the differential unit 32, that is, the source voltages of the transistors M11 and M12 become equal to the source voltages of the transistors M3 and M4 in the input unit 31a.

Further, the bias voltage control unit 41 may prevent the difference between the voltage Vps1 of the node N3 and the voltage Vps2 of the node N11 due to a factor such as a change in temperature. As a result, the shift in timing between the output signals OUT and XOUT due to the change in temperature or the like may be suppressed.

It should be apparent to those skilled in the art that the aforementioned embodiments may be embodied in many other forms without departing from the scope of the invention. Particularly, it should be understood that the aforementioned embodiments may be embodied in the following forms.

In the above embodiments, the p-channel MOS transistor and the n-channel MOS transistor may be exchanged with each other. Even if the polarities of the transistors are exchanged with each other, the differential amplifier (output circuit) has the advantages as those by the above embodiments.

Figure 6:
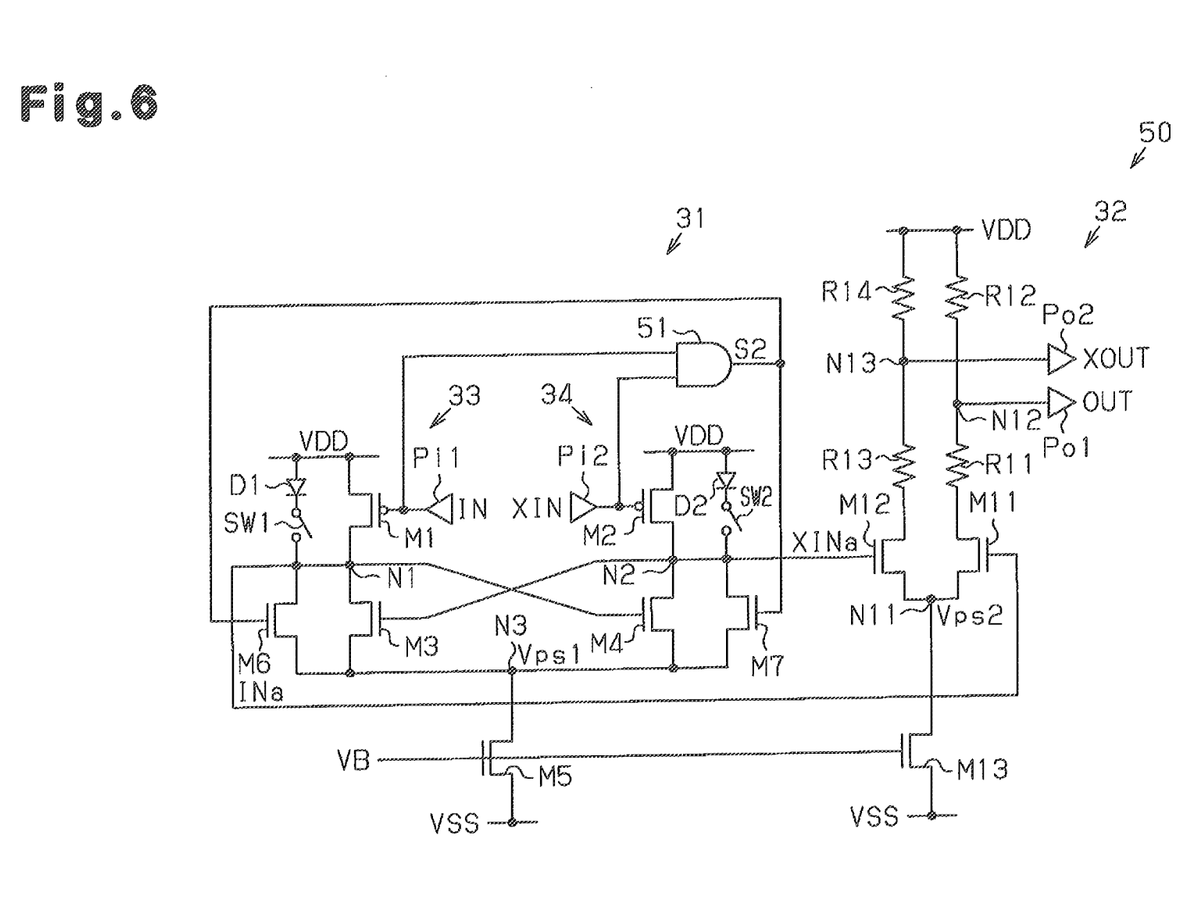
FIG. 6 is a circuit diagram of another differential amplifier.

For example, the differential amplifier 30 illustrated in FIG. 3 may be changed to such as that illustrated in FIG. 6. Components of a differential amplifier 50 illustrated in FIG. 6 are given the same symbols as those of the differential amplifier 30 illustrated in FIG. 3. Of course, the connections of the diodes D1 and D2 and the setting of the potentials are made opposite with respect to the differential amplifier 30 illustrated in FIG. 3.

The differential amplifier 50 includes an AND gate 51 in place of the OR gate 35 illustrated in FIG. 3. The AND gate 51 is one example of a signal generation circuit. The AND gate 51 outputs a control signal S2 having an H level when the input signals IN and XIN are both at the H level and outputs the control signal S2 having an L level when at least one of the input signals IN and XIN is at the L level. The control signal S2 is supplied to the gates of transistors M6 and M7. The transistors M6 and M7 are activated in response to the control signal 52 having the H level and deactivated in response to the control signal S2 having the L level. The activated transistor M6 couples the source and the drain of the transistor M3 to each other. Similarly, the activated transistor M7 couples the source and the drain of the transistor M4 to each other. Therefore, when the input signals IN and XIN are both at the H level, the potentials of the nodes N1 and N2 become equal to the potential of the node N3. That is, in response to input signals IN and XIN having the H level, the AND gate 51 and the transistors M6 and M7 set the potentials of the internal signals INa and XINa to be equal to the potential of the node N3. Therefore, when the input signals IN and XIN are both at the H level, the output signals OUT and XOUT may both be kept at the H level (level of the high potential voltage VDD).

In the above embodiments, for example, the current ratio of the transistor M5 to the transistor M13 (for example, the number of the first unit transistors of the transistor M13) may be changed appropriately. Similarly, the current ratio of the transistor M4 to the transistor M11 (for example, the number of the second unit transistors of the transistor M11) may be changed appropriately. Similarly, the current ratio of the transistor M3 to the transistor M12 (for example, the number of the third unit transistors of the transistor M12) may be changed appropriately. Further, when changing the current ratio between the transistors M5 and M13, each of the transistors M5 and M13 may be formed by a plurality of unit transistors coupled in parallel with each other. The same applies to the case of changing the current ratio between the transistors M4 and M11 as well as to the case of changing the current ratio between the transistors M3 and M12.

In the above embodiments, the switches SW1 and SW2 may be omitted.

In the above embodiments, the switches SW1 and SW2 and the diodes D1 and D2 may be omitted.

In the above embodiments, the transistors M6 and M7 and the OR gate 35 or the AND gate 51 that generates the signals for controlling the transistors M6 and M7 may be omitted.

In the above embodiments, the OR gate 35 may be replaced with an exclusive OR gate (EX-OR gate). The EX-OR gate outputs a signal having an L level in response to the input signals IN and XIN having the same level (both of which are at the H or L level) and outputs the signal having an H level in response to the input signals IN and XIN having the different levels. Thus, in response to the input signals IN and XIN having the same level, the EX-OR gate and the transistors M6 and M7 set the potentials of the internal signals INa and XINa to be equal to the potential at the node N3. Therefore, when the input signals IN and XIN are both at the L or H level, the output signals OUT and XOUT may be both set to the L level (low potential voltage VSS level). The use of the EX-OR gate enables providing a driver circuit that complies with a given data transfer standard (for example, universal serial bus (USB) standard 2.0).

Although in the above embodiments the differential amplifier 30, 40, or 50 has been employed as a driver circuit that performs data transfer between the apparatuses (the personal computer 11 and the digital camera 12 illustrated in FIG. 1), the differential amplifier may also be used when outputting a signal from any other devices. For example, the differential amplifier may be used when outputting a signal from one device to any other device in one apparatus or when outputting a signal from one circuit to any other circuit in one semiconductor device.

All examples and conditional language recited herein are intended for pedagogical purposes to aid the reader in understanding the principles of the invention and the concepts contributed by the inventor to furthering the art, and are to be construed as being without limitation to such recited examples and conditions, nor does the organization of such examples in the specification relate to an illustration of the superiority and inferiority of the invention. Although the embodiment(s) of the present invention(s) has (have) been described in detail, it should be understood that the various changes, substitutions, and alterations could be made hereto without departing from the spirit and scope of the invention.

The invention claimed is:

1. An output circuit comprising:
a first transistor including a gate, a source, and a drain, wherein the gate of the first transistor is supplied with one of two input signals;
a second transistor including a gate, a source, and a drain, wherein the gate of the second transistor is supplied with the other of the two input signals;
a third transistor including a drain coupled to the drain of the first transistor, a gate coupled to the drain of the second transistor, and a source;
a fourth transistor including a gate coupled to the drain of the first transistor, a drain coupled to the drain of the second transistor, and a source;
a first constant current unit coupled to the source of the third transistor and the source of the fourth transistor;
a differential pair including two transistors, the two transistors of the differential pair each including a gate, a source, and a drain, wherein the gate of one of the two transistors of the differential pair is coupled to the drain of the first transistor, and the gate of the other of the two transistors of the differential pair is coupled to the drain of the second transistor; and
a second constant current unit coupled to the sources of the two transistors of the differential pair,
wherein two output signals are output from two nodes respectively corresponding to the drains of the two transistors of the differential pair.

2. The output circuit according to claim 1, wherein:
a threshold voltage of each of the two transistors of the differential pair is equal to a threshold voltage of each of the third and fourth transistors; and
a source voltage of each of the two transistors of the differential pair is equal to a source voltage of each of the third and fourth transistors.

3. The output circuit according to claim 1, wherein:
the first constant current unit includes a first constant current transistor that is coupled between a first wiring supplied with a first voltage and the sources of the third and fourth transistors, the first constant current transistor including a gate supplied with a first bias voltage;
the second constant current unit includes a second constant current transistor that is coupled between the first wiring and the sources of the two transistors of the differential pair, the second constant current transistor including a gate supplied with the first bias voltage; and
the first constant current transistor and the second constant current transistor are formed in shapes that are similar to each other.

4. The output circuit according to claim 1, wherein:
the first constant current unit includes a first constant current transistor that is coupled between a first wiring supplied with a first voltage and the sources of the third and fourth transistors, the first constant current transistor including a gate supplied with a first bias voltage; and
the second constant current unit includes a second constant current transistor that is coupled between the first wiring and the sources of the two transistors of the differential pair, the second constant current transistor including a gate supplied with a second bias voltage,
the output circuit further comprising a bias voltage control unit that generates the first bias voltage so that a source voltage of each of the third and fourth transistors becomes equal to a reference voltage generated based on the second bias voltage.

5. The output circuit according to claim 1, wherein:
each of the third transistor, the fourth transistor, and the first constant current unit is one transistor or one of a plurality of transistors coupled in parallel with each other;
each of the two transistors of the differential pair and the second constant current unit is one of a plurality of transistors coupled in parallel with each other; and
a ratio of the number of the fourth transistor to the number of one of the two transistors of the differential pair, a ratio of the number of the third transistor to the number of the other of the two transistors of the differential pair, and a ratio of the number of the first constant current unit to the number of the second constant current unit are equal to each other.

6. The output circuit according to claim 1, further comprising:
a first diode coupled in parallel with the first transistor; and
a second diode coupled in parallel with the second transistor.

7. The output circuit according to claim 6, further comprising:
a first switch coupled in series with the first diode; and
a second switch coupled in series with the second diode.

8. The output circuit according to claim 1, further comprising:
a sixth transistor coupled in parallel with the third transistor;
a seventh transistor coupled in parallel with the fourth transistor; and
a signal generation circuit that generates a control signal to deactivate the sixth and seventh transistors when the two input signals are both at a first level.

9. An output circuit comprising:
an input unit that generates two internal signals in accordance with two input signals; and
a differential unit that generates two output signals in accordance with the two internal signals, wherein
the differential unit includes:
a pair of transistors supplied with the two internal signals respectively, the transistors each including a source, the sources of the transistors being coupled to each other; and
a constant current unit coupled to the sources of the transistors, and the input unit includes a pair of inverters that are cross-coupled and supplied with the two input signals respectively, wherein the input unit delays the two internal signals based on source voltages of the transistors and threshold voltages of the transistors.

* * * * *